United States Patent
Ha et al.

(10) Patent No.: US 7,137,044 B2
(45) Date of Patent: Nov. 14, 2006

(54) INTERLEAVER AND INTERLEAVING METHOD IN A COMMUNICATION SYSTEM

(75) Inventors: Sang-Hyuck Ha, Suwon-shi (KR); Min-Goo Kim, Suwon-shi (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 519 days.

(21) Appl. No.: 10/724,877

(22) Filed: Dec. 2, 2003

(65) Prior Publication Data

US 2004/0170232 A1 Sep. 2, 2004

Related U.S. Application Data

(62) Division of application No. 10/359,162, filed on Feb. 6, 2003.

(30) Foreign Application Priority Data

Feb. 6, 2002 (KR) ................................. 2002-6890

(51) Int. Cl.
*H03M 13/27* (2006.01)

(52) U.S. Cl. ..................................... 714/701; 714/702
(58) Field of Classification Search ................ 714/701, 714/702
See application file for complete search history.

(56) References Cited

U.S. PATENT DOCUMENTS

| | | | |
|---|---|---|---|
| 2002/0032890 A1* | 3/2002 | Rowitch et al. | 714/755 |
| 2002/0046371 A1* | 4/2002 | Halter | 714/702 |
| 2002/0087923 A1* | 7/2002 | Eroz et al. | 714/702 |
| 2003/0031122 A1* | 2/2003 | Kim et al. | 370/209 |
| 2003/0147474 A1* | 8/2003 | Ha et al. | 375/295 |
| 2003/0167436 A1* | 9/2003 | Ha et al. | 714/756 |

* cited by examiner

*Primary Examiner*—Stephen M. Baker
(74) *Attorney, Agent, or Firm*—Roylance, Abrams, Berdo & Goodman, L.L.P.

(57) ABSTRACT

A P-BRO interleaver and a method for optimizing parameters according to an interleaver size for the P-BRO interleaver. The P-BRO interleaver sequentially, by columns, arranges an input data stream of size N in a matrix having $2^m$ rows and (J–1) columns, and R rows in a Jth column, P-BRO interleaves the arranged data, and reads the interleaved data by rows.

5 Claims, 7 Drawing Sheets

US 7,137,044 B2

INTERLEAVER AND INTERLEAVING METHOD IN A COMMUNICATION SYSTEM

This application is a divisional application of U.S. patent application Ser. No. 10/359,162, filed on Feb. 6, 2003, the entire content of which is incorporated herein by reference.

PRIORITY

This application claims priority to an application entitled "INTERLEAVING METHOD IN A COMMUNICATION SYSTEM" filed in the Korean Industrial Property Office on Feb. 6, 2002 and assigned Serial No. 2002-6890, the contents of which are herein expressly incorporated by reference.

BACKGROUND OF THE INVENTION

1. Field of the Invention

The present invention relates generally to interleaving in a communication system, and in particular, to a method of optimizing parameters according to an interleaver size for partial bit reversal order (P-BRO) interleaving and an interleaver using the same.

2. Description of the Related Art

While a sub-block channel interleaver designed in accordance with the IS-2000 Release C(1×EV-DV) F/L specification performs P-BRO operation for row permutation similarly to an existing channel interleaver designed in accordance with the IS-2000 Release A/B spec., the sub-block channel interleaver differs from the channel interleaver in that the former generates read addresses in a different manner and requires full consideration of the influence of a selected interleaver parameter on Quasi-Complementary Turbo code (QCTC) symbol selection.

Hence, there is a need for analyzing the operating principles of the sub-interleaver block channel interleaver and the channel interleaver and creating criteria on which to generate optimal parameters for the channel interleavers. The optimal parameters will offer the best performance in channel interleavers built in accordance with both the IS-2000 Release A/B and IS-2000 Release C.

SUMMARY OF THE INVENTION

An object of the present invention is to substantially solve at least the above problems and/or disadvantages and to provide at least the advantages described below. Accordingly, it is an object of the present invention to provide a method of optimizing parameters for P-BRO interleaving and an interleaver using the optimizing parameters.

It is another object of the present invention to provide a method of optimizing parameters m and J according to an interleaver size for P-BRO interleaving and an interleaver using the same To achieve the above and other objects, there are provided a P-BRO interleaver and a method for optimizing parameters according to an interleaver size for the P-BRO interleaver. The P-BRO interleaver sequentially, by columns, arranges an input data stream of size N in a matrix having $2^m$ rows, (J−1) columns, and R rows in the Jth column, The P-BRO interleaver interleaves the arranged data, and reads the interleaved data by rows. Here, N, m, J and R are given as follows:

| N | m | J | R |
|---|---|---|---|
| 408 | 7 | 4 | 24 |
| 792 | 8 | 4 | 24 |
| 1560 | 9 | 4 | 24 |
| 2328 | 10 | 3 | 280 |
| 3096 | 10 | 4 | 24 |
| 3864 | 11 | 2 | 1816 |

BRIEF DESCRIPTION OF THE DRAWINGS

The above and other objects, features and advantages of the present invention will become more apparent from the following detailed description of preferred embodiments thereof when taken in conjunction with the accompanying drawings, in which.

DETAILED DESCRIPTION OF THE PREFERRED EMBODIMENTS

Figure 1:
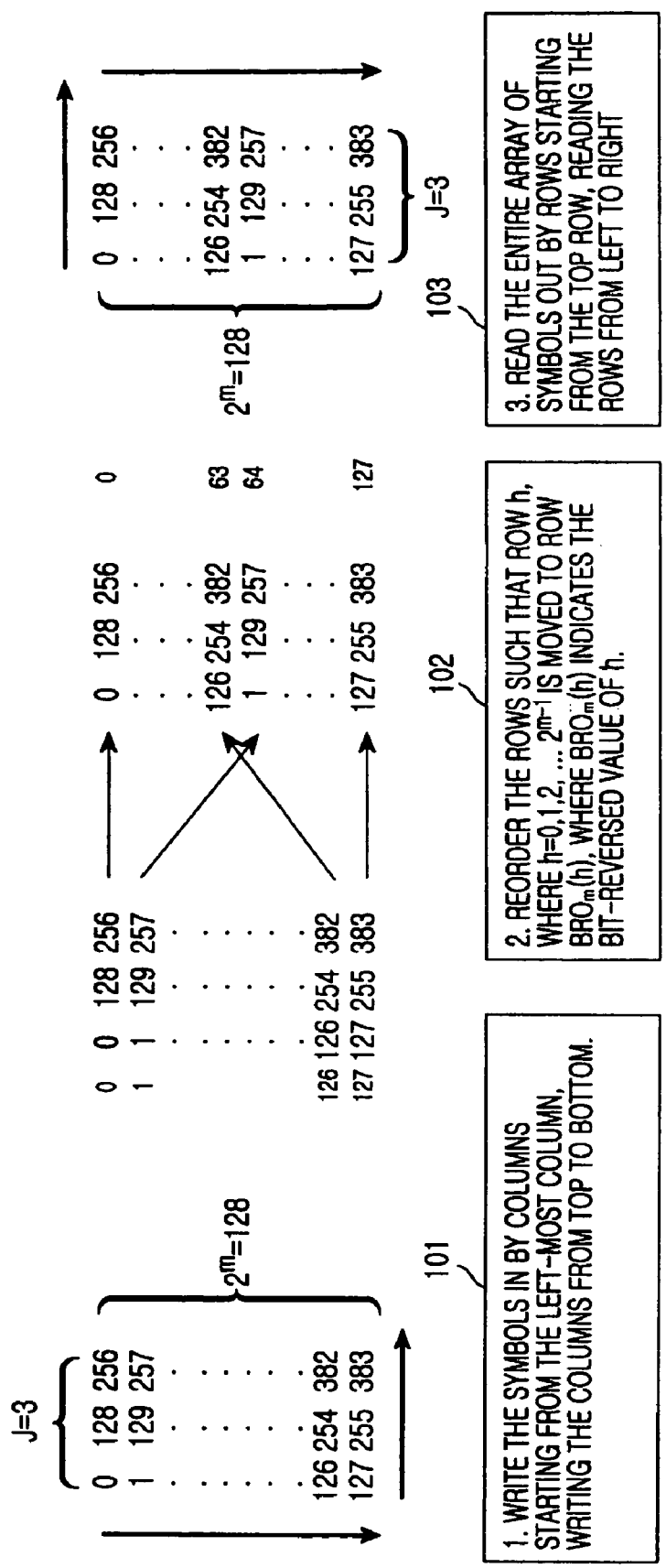
FIG. 1 illustrates P-BRO interleaving when N=384, m=7 and J=3 according to an embodiment of the present invention.

Several preferred embodiments of the present invention will be described in detail with reference to the accompanying drawings. In the drawings, the same or similar elements are denoted by the same reference numerals, even though they are depicted in different drawings. In the following description, a detailed description of known functions or configurations incorporated herein have been omitted for conciseness.

Hereinbelow, a description will be made of P-BRO interleaving to which various embodiments of the present invention are applied, as well as the principle of determining parameters for optimal P-BRO interleaving in accordance with embodiments of the present invention.

Figure 5:
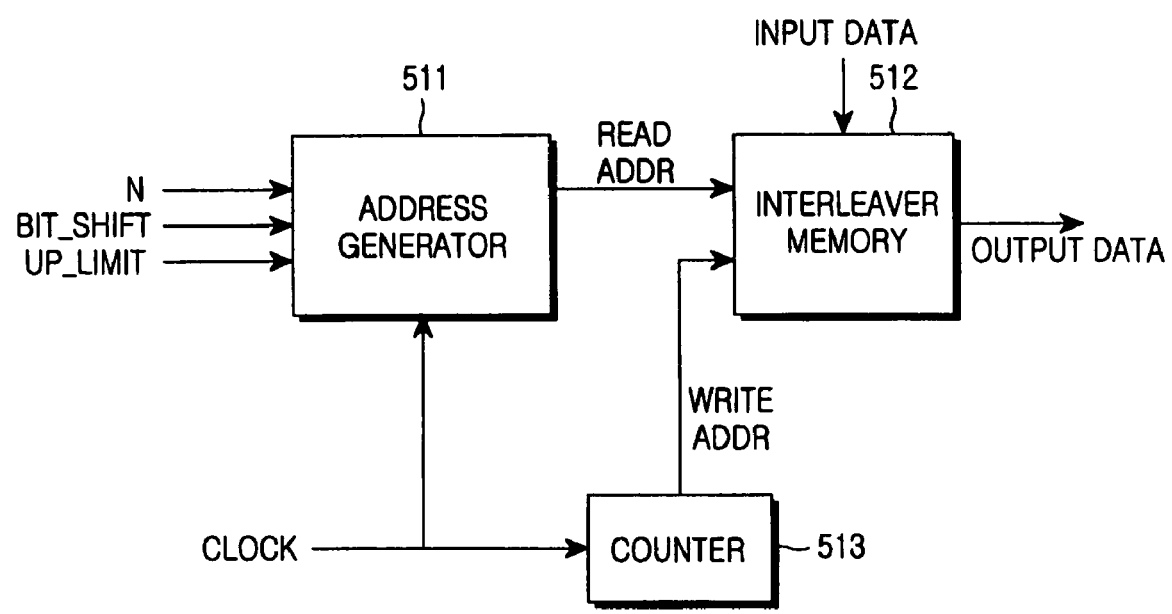
FIG. 5 is a block diagram of an interleaver to which an embodiment of the present invention is applied.

FIG. 5 is a block diagram of a P-BRO interleaver to which an embodiment of the present invention is applied. Referring to FIG. 5, an address generator 511 receives an interleaver size N, a first parameter m (i.e., Bit_Shift), a second parameter J (i.e., Up_Limit) and a clock signal Clock, and generates read addresses to read bit symbols from an interleaver memory 512. The parameters m and J are determined in an higher-layer controller (not shown) and provided to the address generator 511, or determined according to the interleaver size N in the address generator 511. The interleaver memory 512 sequentially stores input bit symbols at write addresses corresponding to count values of a counter 513 in a write mode, and outputs bit symbols from read addresses received from the address generator 511 in a read mode. The counter 513 receives the clock signal Clock, generates a count value, and provides it as a write address Write ADDR to the interleaver memory 512.

As described above, the P-BRO interleaver writes input data sequentially in the interleaver memory 512 in the write mode and reads data from the interleaver memory 512 according to read addresses generated from the address generator 511. For details of the P-BRO interleaver, reference is made to Korea Patent Application No. 1998-54131, filed on Dec. 10, 1998, the entire contents of which are expressly incorporated herein.

In operation, the address generator 511 generates a read address $A_i$ for symbol permutation by $$A_i = 2^m (i \bmod J) + BRO_m(\lfloor i/J \rfloor) \qquad (1)$$

where $i = 0, 1, \ldots, N-1$ and $N = 2^m \times J$.

In Eq. (1), N denotes the size of an interleaver input sequence and m and J are interleaver parameters called Up_Limit and Bit_Shift, respectively.

FIG. 1 illustrates P-BRO interleaving when $N=384$, $m=7$ and $J=3$. Referring to FIG. 1, an interleaving matrix has $2^m$ rows starting from index 0 and J columns starting from index 0. After step 101, the row index and column index of a symbol in the resulting matrix are expressed as $\lfloor i/J \rfloor$ and $(i \bmod J)$, respectively. Therefore, after $2^m (i \bmod J) + \lfloor i/J \rfloor$, an ith symbol in an input sequence has a number corresponding to an $\lfloor i/J \rfloor$th row and an $(I \bmod J)$ column as its read address. J symbols are in each row and the distance between symbols is $2^m$ in the row.

Figure 2:
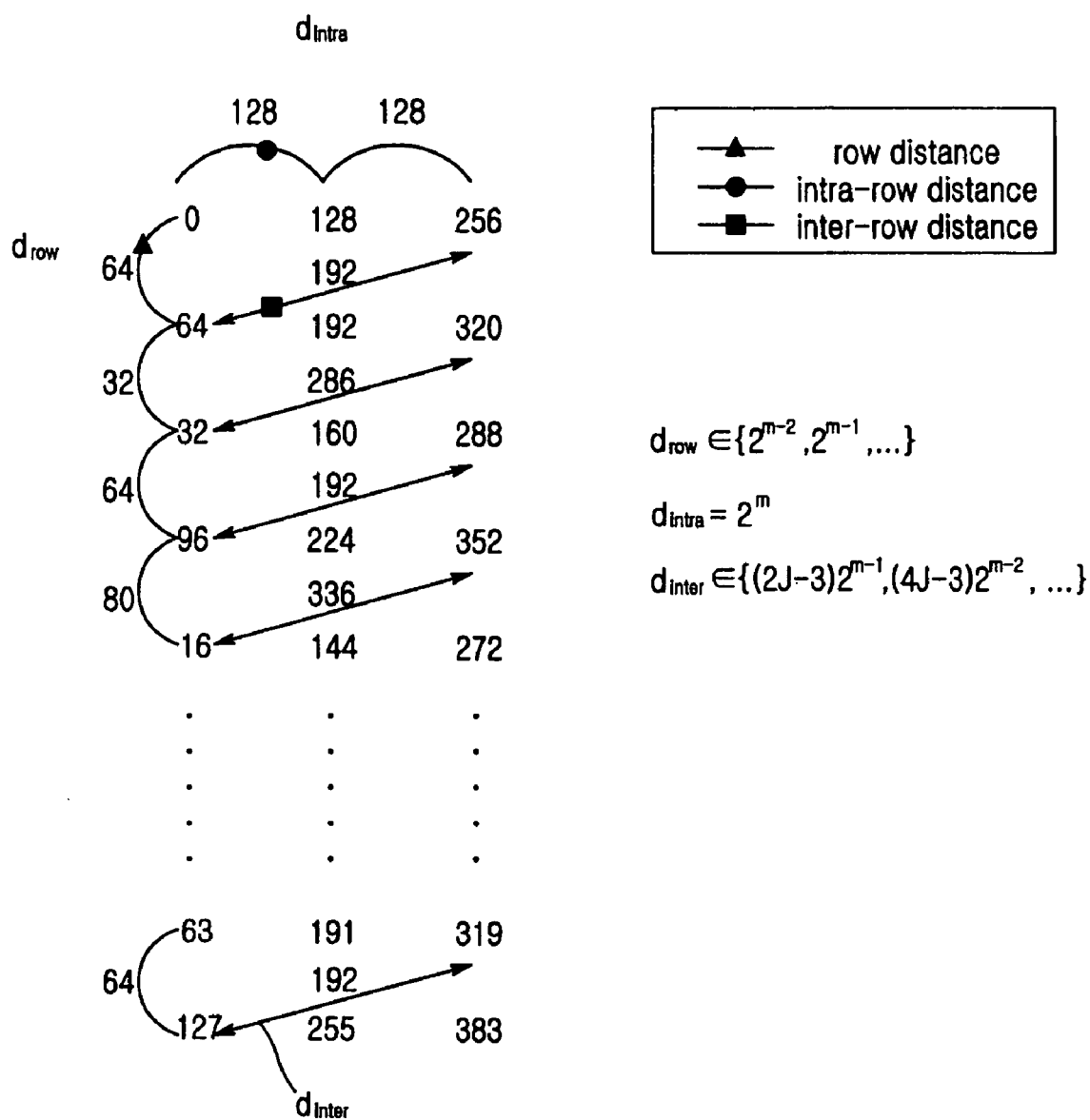
FIG. 2 illustrates distances between read addresses after P-BRO interleaving when N=384, m=7 and J=3 according to an embodiment of the present invention.

The row index $\lfloor i/J \rfloor$ is BRO-operated in step 102. If the distance between symbols in adjacent rows of the same column is row distance $d_{row}$, the BRO operation of the row indexes results in a row permutation such that two minimum row distances $d_{row}$ are $2^{m-2}$ and $2^{m-1}$, as illustrated in FIG. 2. Thus, after $2^m (i \bmod J) + BRO_m \lfloor i/J \rfloor$, the ith symbol in the input sequence has a number corresponding to a $BRO_m \lfloor i/J \rfloor$th row and an $(i \bmod J)$th column as its read address in the third matrix from the left. In summary, a read address sequence is generated by row permutations of a $2^m \times J$ matrix in the P-BRO interleaver. The row-permuted matrix is read first by rows from the top to the bottom, then subsequently reading each row from the left to the right.

For clarity of description, the distance between adjacent addresses in the same row is defined as "intra-row distance $d_{intra}$". If $J \neq 1$, $d_{intra} = 2^m$. If $J = 1$, there is no intra-row distance.

The distance between adjacent addresses in different rows, that is, the distance between the last address in a row and the first address in the next row is defined as "inter-row distance $d_{inter}$". $d_{inter}$ is one of a plurality of values calculated from a function of the parameters m and J. When m and J are determined, the resulting minimum inter-row distance $d_{inter}$ is defined as $d_{inter}^{min}$.

Since two minimum rows distances $d_{row}$ are $2^{m-2}$ and $2^{m-1}$,

If $J=1$, $d_{inter}^{min} = d_{row}^{min} = 2^{m-2}$,

Else, $d_{inter}^{min} = (J-1) \cdot 2^m - 2^{m-1} = (2 \cdot J - 3) \cdot 2^{m-1}$ \qquad (2)

The reason for computing $d_{inter}^{min}$ by Eq. (2) when $J \neq 1$ is apparent in FIG. 2. If $J=1$, which implies that the interleaving matrix has only one column, $d_{inter}^{min}$ is $d_{row}^{min}$, that is, $2^{m-2}$.

As described above, the interleaver parameters m and J are used as the numbers of rows and columns in a read address sequence matrix and parameters for a function that determines distances between read addresses. Consequently, the characteristics of the P-BRO channel interleaver depend on the interleaver parameters m and J.

Before presenting a description of a method of determining sub-block channel interleaver parameters that ensure the best interleaving performance according to an embodiment of the present invention, the purposes of channel interleavers in the IS-2000 specifications, Releases A/B and C will first be described. Following that, the interleaver parameter determination will then be described separately in two cases: $N = 2^m \times J$; and $N = 2^m \times J + R$.

The purpose of channel interleaving in the IS-2000 specification, Release A/B, is to improve decoding performance, which is degraded when fading adversely influences successive code symbols, through error scattering resulting from symbol permutation. To improve decoding performance, interleaving must be performed such that the distance between adjacent addresses (inter-address distance) is maximized.

Meanwhile, the purpose of sub-block channel interleaving as described in the IS-2000 specification, Release C, is to allow a QCTC symbol selector at the rear end of an interleaver to select appropriate code symbols according to a coding rate and thus ensure the best performance at the coding rate, as well as to scatter errors through symbol permutation. To achieve this purpose, interleaving must be performed such that inter-address distances are maximized and are uniform.

Accordingly, to satisfy the requirements of the channel interleaver of the IS-2000 specification, Release A/B, and the sub-block channel interleaver of the IS-2000 specification, Release C, an interleaver must be designed so that a read address sequence is uniformly permuted by interleaving. This is possible by determining the interleaver parameters m and j that maximize a minimum inter-address distance and minimize the difference between inter-address distances.

As stated before, the inter-address distances are categorized into the intra-row distance $d_{intra}$ and the inter-row distance $d_{inter}$. The intra-row distance is a function of m and the inter-row distance is a function of m and J. Since there are a plurality of inter-row distances, a minimum inter-row distance $d_{inter}^{min}$ is calculated. A minimum inter-address distance is always $2^{m-2}$ when J is 1, and the smaller of the minimum inter-row distance $d_{inter}^{min}$ and the minimum intra-row distance $d_{intra}^{min}$ when J is not 1. The difference between inter-address distances is $2^{m-2}$ when J is 1, since the intra-row distance $d_{intra}$ is 0, and is equal to the difference between the intra-row distance $d_{intra}$ and the minimum inter-row distance $d_{inter}^{min}$ when J is not 1.

This can be expressed as follows:

If $J=1$, $|0 - 2^{m-2}| 2^{m-2}$,

Else, $|d_{intra} - d_{inter}^{min}| = |2^m - (2 \cdot J - 3) \cdot 2^{m-1}| = |2 \cdot J - 5| \cdot 2^{m-1}$ \qquad (3)

Since $N = 2^m \times J$, $2^m$ is replaced by N/J in Eq. (3), it follows that $$\text{If } J = 1, \ 2^{m-2} = \frac{1}{4} \cdot \frac{N}{J} = 0.25 \frac{N}{J}, \qquad (4)$$

$$\text{Else, } |d_{intra} - d_{inter}^{\min}| = |2 \cdot J - 5| \cdot 2^{m-1} = \left|J - \frac{5}{2}\right| \frac{N}{J} = \left|1 - \frac{2.5}{J}\right| \cdot N$$

When J=3 in Eq. (4), the difference between inter-address distances is minimized. Thus $|d_{intra}-d_{inter}^{min}|=0.166667N$.

Table 1 below illustrates changes in inter-read address distances as m increases when N=384. When J=3, a maximum difference between inter-address distances is minimized, 64 and a minimum inter-address distance $d^{min}$ is maximized, 128.

TABLE 1

| N | m | J | $d_{intra}$ | $d_{inter}^{min}$ | $|d_{intra} - d_{inter}^{min}|$ | $d^{min}$ |
|---|---|---|---|---|---|---|
| 384 | 4 | 24 | 16 | 360 | 344 | 16 |
| | 5 | 12 | 32 | 336 | 304 | 32 |
| | 6 | 6 | 64 | 288 | 224 | 64 |
| | 7 | 3 | 128 | 192 | 64 | 128 |

The method of determining optimal interleaver parameters when $N=2^m \times J$ has been described above. Now, a method of determining optimal interleaver parameters when $N=2^m \times J+R$ will be described. Here, R is the remainder of dividing N by $2^m$. Thus R is a positive integer less than $2^m$.

Figure 3:
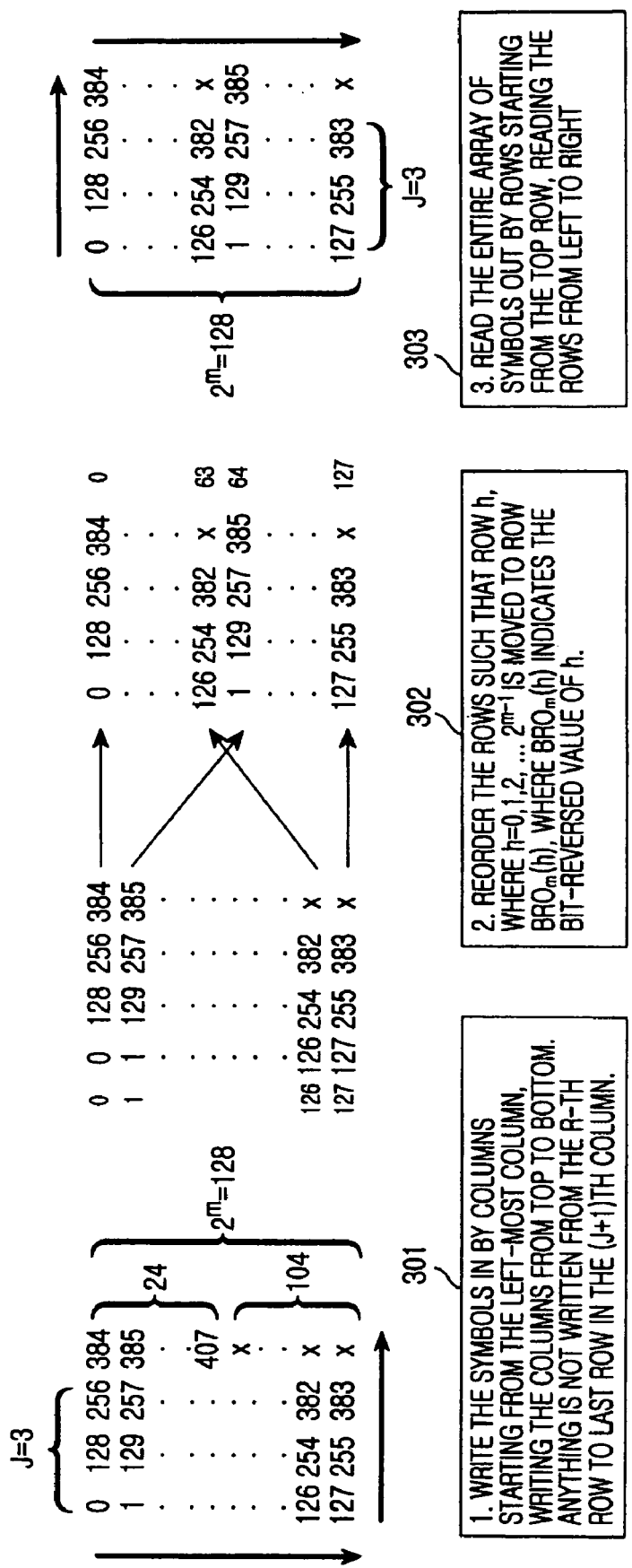
FIG. 3 illustrates P-BRO interleaving when N=408, m=7, J=3 and R=24 according to an embodiment of the present invention.

FIG. 3 illustrates P-BRO interleaving when N=408, m=7, J=3 and R≠0. Referring to FIG. 3, similarly to the case where R=0, numbers in a row-permuted matrix after step 302 are read as read addresses by rows from the top to the bottom, reading each row from the left to the right, as described in step 303. Since R≠0, the number of columns is J+1, and numbers are filled in only R rows of a (J+1)th column with no numbers in the other ($2^m$-R) rows.

In summary, when R≠0, a read address sequence is generated by a row permutation of a $2^m \times J$ matrix, each row including J or J+1 elements in the P-BRO interleaver. The row-permuted matrix is read by rows from the top to the bottom, reading each row from the left to the right.

Furthermore, when R≠0, the interleaver parameters m and J are determined such that a minimum inter-read address distance is maximized and the difference between inter-read address distances is minimized.

An inter-row distance $d_{inter}$ is a function of m, $2^m$ irrespective of whether R=0 or R≠0. However, while the minimum inter-row distance $d_{inter}^{min}$ is a function of m and J when R=0, it is a function of m, J and R when R≠0.

The minimum inter-row distance is determined according to J by Eq. (5) and Eq. (6).

When J=1,

For $0 \leq R < 3 \cdot 2^{m-2}$, $d_{inter}^{min}=2^{m-2}$

For $3 \cdot 2^{m-2} \leq R < 2^m$, $d_{inter}^{min}=2^{m-1}$ (5)

When J≠1,

For $0 < R < 2^{m-1}$, $d_{inter}^{min}=(J-1) \cdot 2^m - 2^{m-1}=(2J-3)$

For $2^{m-1} \leq R < 3 \cdot 2^{m-2}$, $d_{inter}^{min}=(J-1) \cdot 2^m - (-2^{m-2})$ For $3 \cdot 2^{m-2} \leq R < 2^m$, $d_{inter}^{min}=J \cdot 2^m - 2^{m-1}=(2J-1) \cdot 2^{m-1}$ (6)

Figure 4:
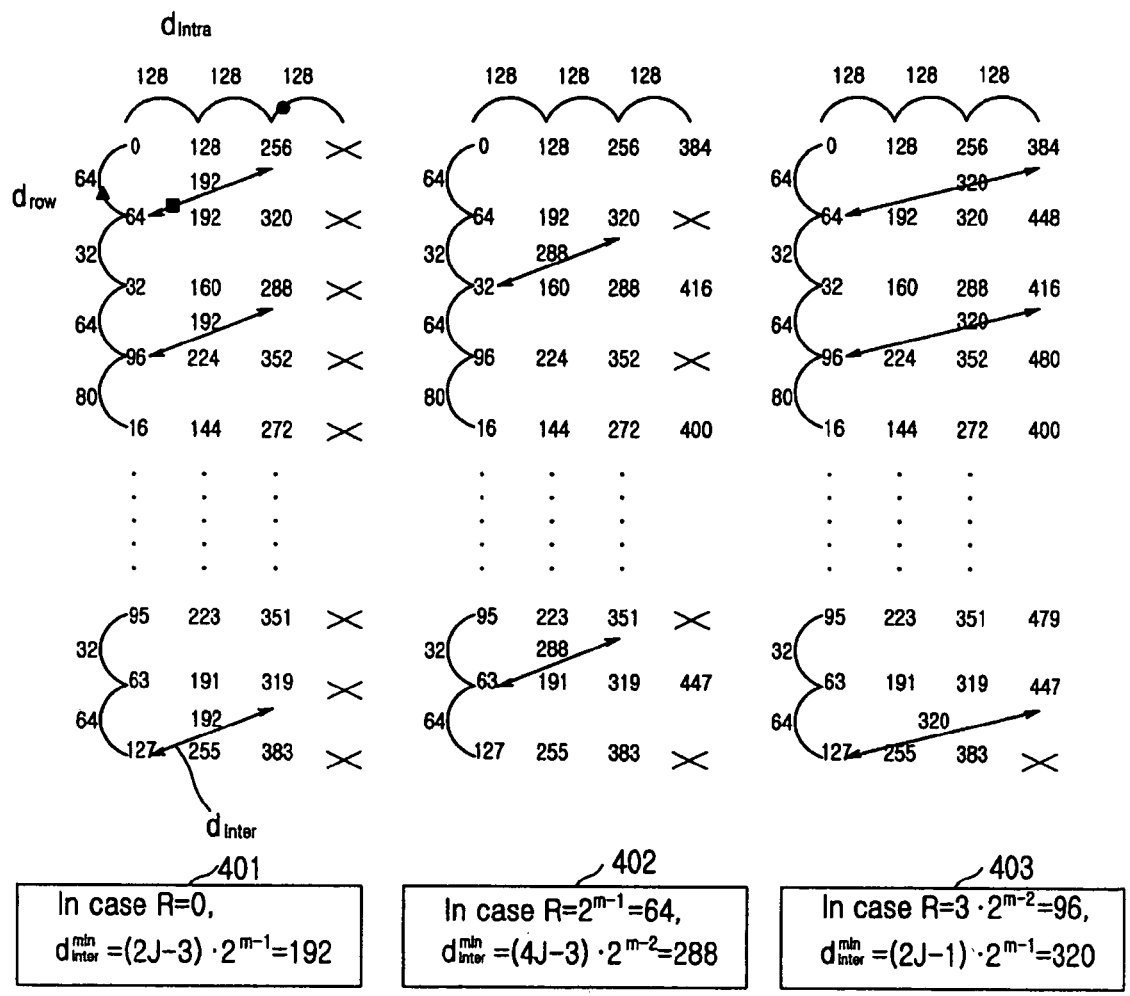
FIG. 4 illustrates the minimum intra-row distance after P-BRO interleaving when N=408, m=7 and J=3 according to an embodiment of the present invention.

FIG. 4 illustrates how Eq. (6) is derived when m=7 and J=3. Referring to FIG. 4, when $0 \leq R < 2^{m-1}$, the inter-row distance between two adjacent rows having a row distance $d_{row}$ of $2^{m-1}$, the last column of the upper row being empty, is a minimum inter-row distance ($d_{inter}^{min}=(2J-3) \cdot 2^{m-1}$). When $2^{m-1} \leq R < 3 \cdot 2^{m-2}$, the inter-row distance between two adjacent rows having a row distance $d_{row}$ of $2^{m-2}$, the last column of the upper row being empty, is a minimum inter-row distance ($d_{inter}^{min}=(4J-3) \cdot 2^{m-2}$).

When $3 \cdot 2^{m-2} \leq R < 2^m$, the inter-row distance between two adjacent rows having a row distance $d_{row}$ of $2^{m-2}$ and elements in the last columns, is a minimum inter-row distance ($d_{inter}^{min}=(2J-1) \cdot 2^{m-1}$). For example, if R=0, the minimum inter-row distance is 192, as indicated by reference numeral 401. If R=64 ($2^{m-1}$), the minimum inter-row distance is 288, as indicated by reference numeral 402. If R=96 ($3 \cdot 2^{m-2}$), the minimum inter-row distance is 320, as indicated by reference numeral 403. In the same manner, Eq. (5) can be derived when J=1.

Table 2 below illustrates changes in the interleaver parameters J and R, the intra-row distance $d_{intra}$, the minimum inter-row distance $d_{inter}^{min}$, and the minimum inter-read address distance $d_{min}$ as m increases, with respect to six encoder packet (EP) sizes as described in the IS-2000 specification, Release C.

TABLE 2

| N | m | J | R | $d_{intra}$ | $d_{inter}^{min}$ | $|d_{intra} - d_{inter}^{min}|$ | $d^{min}$ | $n(d^{min})$ |
|---|---|---|---|---|---|---|---|---|
| 408 | 3 | 51 | 0 | 8 | 396 | 388 | 8 | 400 |
| | 4 | 25 | 8 | 16 | 388 | 372 | 16 | 392 |
| | 5 | 12 | 24 | 32 | 368 | 336 | 32 | 376 |
| | 6 | 6 | 24 | 64 | 288 | 224 | 64 | 344 |
| | 7 | 3 | 24 | 128 | 192 | 64 | 128 | 280 |
| | 8 | 1 | 152 | 256 | 64 | 192 | 64 | 40 |
| 792 | 4 | 49 | 8 | 16 | 772 | 756 | 16 | 776 |
| | 5 | 24 | 24 | 32 | 752 | 720 | 32 | 760 |
| | 6 | 12 | 24 | 64 | 672 | 608 | 64 | 728 |
| | 7 | 6 | 24 | 128 | 576 | 448 | 128 | 664 |
| | 8 | 3 | 24 | 256 | 384 | 128 | 256 | 536 |
| | 9 | 1 | 280 | 512 | 128 | 384 | 128 | 104 |
| 1560 | 5 | 48 | 24 | 32 | 1520 | 1488 | 32 | 1528 |
| | 6 | 24 | 24 | 64 | 1440 | 1376 | '64 | 1496 |
| | 7 | 12 | 24 | 128 | 1344 | 1216 | 128 | 1432 |
| | 8 | 6 | 24 | 256 | 1152 | 896 | 256 | 1304 |
| | 9 | 3 | 24 | 512 | 768 | 256 | 512 | 1048 |
| | 10 | 1 | 536 | 1024 | 256 | 768 | 256 | 232 |
| 2328 | 6 | 36 | 24 | 64 | 2208 | 2144 | 64 | 2264 |
| | 7 | 18 | 24 | 128 | 2112 | 1984 | 128 | 2200 |
| | 8 | 9 | 24 | 256 | 1920 | 1664 | 256 | 2072 |
| | 9 | 4 | 280 | 512 | 1664 | 1152 | 512 | 1816 |
| | 10 | 2 | 280 | 1024 | 512 | 512 | 512 | 232 |
| | 11 | 1 | 280 | 2048 | 512 | 1536 | 512 | 512 |

TABLE 2-continued

| N | m | J | R | $d_{intra}$ | $d_{inter}^{min}$ | $|d_{intra} - d_{inter}^{min}|$ | $d^{min}$ | $n(d^{min})$ |
|---|---|---|---|---|---|---|---|---|
| 3096 | 6 | 48 | 24 | 64 | 2976 | 2912 | 64 | 3032 |
|  | 7 | 24 | 24 | 128 | 2880 | 2752 | 128 | 2968 |
|  | 8 | 12 | 24 | 256 | 2688 | 2432 | 256 | 2840 |
|  | 9 | 6 | 24 | 512 | 2304 | 1792 | 512 | 2584 |
|  | _10_ | _3_ | _24_ | _1024_ | _1536_ | _512_ | _1024_ | _2072_ |
|  | 11 | 1 | 1048 | 2048 | 512 | 1536 | 512 | 488 |
| 3864 | 6 | 60 | 24 | 64 | 3744 | 3680 | 64 | 3800 |
|  | 7 | 30 | 24 | 128 | 3648 | 3520 | 128 | 3736 |
|  | 8 | 15 | 24 | 256 | 3456 | 3200 | 256 | 3608 |
|  | 9 | 7 | 280 | 512 | 3200 | 2688 | 512 | 3352 |
|  | 10 | 3 | 792 | 1024 | 2560 | 1536 | 1024 | 2840 |
|  | _11_ | _1_ | _1816_ | _2048_ | _1024_ | _1024_ | _1024_ | _1024_ |

As described above, similarly to the case where R=0, optimal interleaver parameters are selected which maximize a minimum inter-address distance and minimize the difference between inter-address distances.

In Table 2, the minimum inter-read address distance $d^{min}$ in the eighth column is the smaller of the intra-row distance $d_{intra}$ and the minimum inter-row distance $d_{inter}^{min}$. Hence, parameters that maximize the minimum inter-read address distance $d^{min}$ can be obtained by selecting a row having the maximum value in the eighth column. For EP sizes of 2328 and 3864, three rows and two rows satisfy this condition. In this case, rows that satisfy another condition of minimizing the difference between inter-read address $|d_{intra}-d_{inter}^{min}|$ must be selected. They are shown in bold and underlined in Table 2. The validity of this condition is apparent by comparing the rows having the maximum $d^{min}$ in terms of $n(d^{min})$ in the last column. Here, $n(d^{min})$ indicates the number of address pairs having a minimum inter-address distance $d^{min}$.

Rows marked in bold and underlined in Table 2 satisfy the above two conditions for selecting optimal interleaver parameters. As noted, once the second condition is satisfied, the first condition is naturally satisfied. For reference, it is made clear that the intra-row distances $d_{intra}$ and the minimum inter-row distances $d_{inter}^{min}$ listed in Table 2 are equal to those computed on P-BRO-interleaved read addresses. Table 2 covers both cases of dividing N by $2^m$ or J with no remainder and of dividing N by $2^m$ or J with a remainder R (i.e., $N=2^m \times J+R$ ($0 \leq R < 2^m$)). Here, interleaver parameters shown in bold and underlined are optimal for each EP size.

When $N=2^m \times (J-1)+R$ ($0 \leq R < 2^m$), that is, N is divided by $2^m$ or J either with no remainder or with a remainder R, optimal interleaver parameters for each interleaver size N are listed in Table 3. The description made in the context of J is also applied when J is replaced by (J-1).

TABLE 3

| N | m | J | R |
|---|---|---|---|
| 408 | 7 | 4 | 24 |
| 792 | 8 | 4 | 24 |
| 1560 | 9 | 4 | 24 |
| 2328 | 10 | 3 | 280 |
| 3096 | 10 | 4 | 24 |
| 3864 | 11 | 2 | 1816 |

The above description has provided a method of selecting interleaver parameters expected to offer the best performance when, for example, a channel interleaver built in accordance with the IS-2000 Release A/B specification, and a sub-block channel interleaver built in accordance with the IS-2000 Release C specification are used.

As described above, the optimal interleaver parameters are those that maximize an inter-address distance and at the same time, minimize the difference between inter-address distances when generating read addresses in a channel interleaver. Consequently, interleaver parameters for sub-block channel interleaving in circumstances wherein a sub-block channel interleaver is built in accordance with the IS-2000 Release C specification are values in the rows in bold and underlined in Table 2. While interleaver parameters selection has been described for the sub-block channel interleaver built in accordance with the IS-2000 Release C specification, it is obvious that the same thing can also be applied to systems of other standards.

Figure 6:
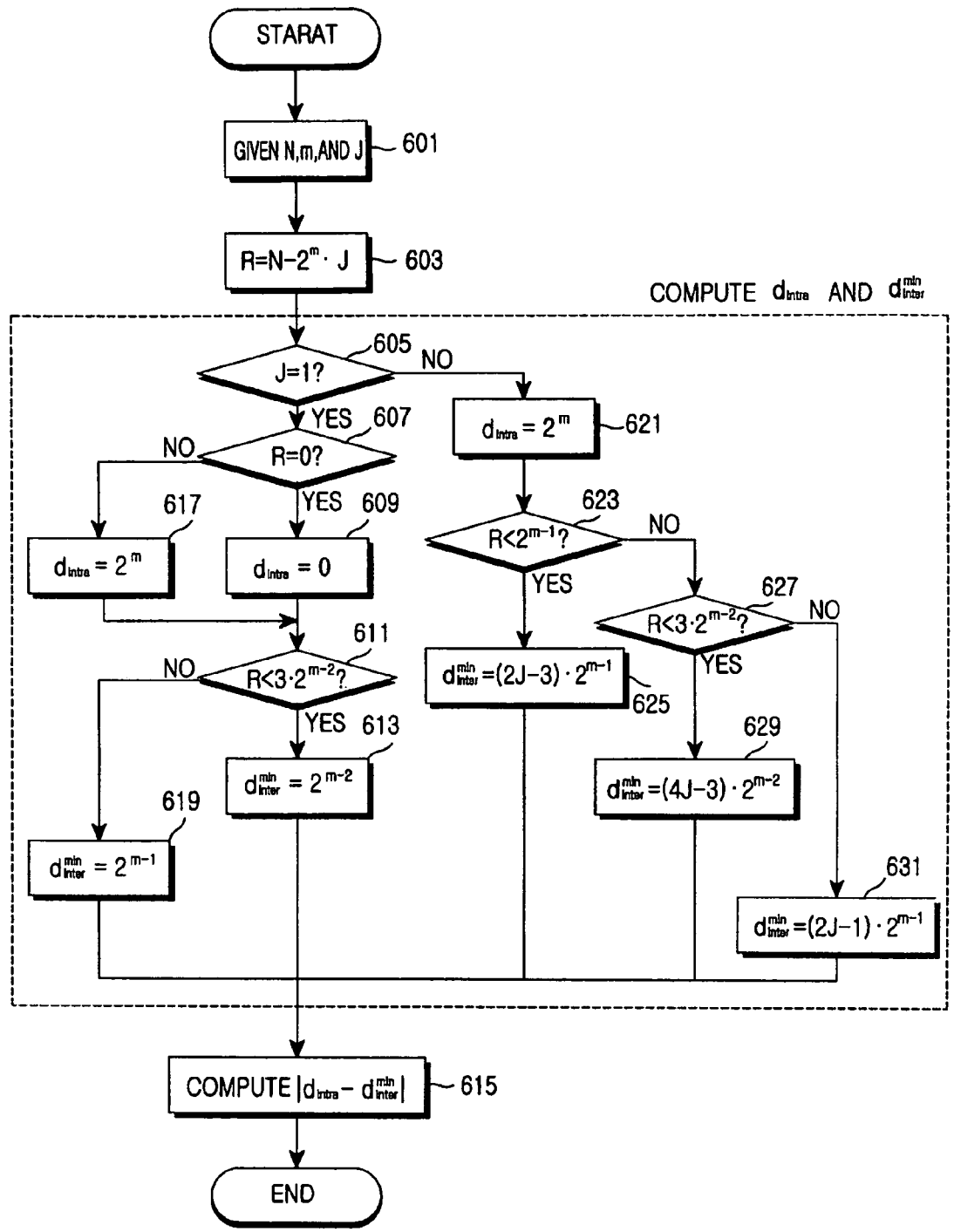
FIG. 6 is a flowchart illustrating a first example of the optimal interleaver parameters determining operation according to an embodiment of the present invention.

FIG. 6 is a flowchart illustrating an optimal interleaver parameters determining operation according to an embodiment of the present invention. Particularly, this operation is concerned with the computation of $|d_{intra-dinter}^{min}|$. An optimal (m, J) that minimizes $|d_{intra}-d_{inter}^{min}|$ is selected by computing $|d_{intra}-d_{inter}^{min}|$, changing (m, J).

Referring to FIG. 6, when an interleaver size N, and parameters m and J are given in step 601, a parameter R is calculated by subtracting $2^m \times J$ from N in step 603. In step 605, it is determined whether J is 1. This is a determination, therefore, of whether an interleaving matrix has a single column or not. If J is 1, the procedure goes to step 607 ("Yes" path from decision step 605) and if J is not 1, the procedure goes to step 621 ("No" path from decision step 605). In step 607, it is determined whether R is 0 (i.e., whether N is an integer multiple of $2^m$). On the contrary, if R is 0 (("Yes" path from decision step 607), an intra-row distance $d_{intra}$ is set to 0 in step 609. If R is not 0 ("No" path from decision step 607), $d_{intra}$ is set to $2^m$ in step 617.

After $d_{intra}$ is determined, it is determined whether R is less than $3 \times 2^{m-2}$ in step 611. If R is less than $3 \times 2^{m-2}$ ("Yes" path from decision step 611) a minimum inter-row distance $d_{inter}^{min}$ is set to $2^{m-2}$ in step 613. If R is equal to or greater than $3 \times 2^{m-2}$ ("No" path from decision step 611) $d_{inter}^{min}$ is set to $2^{m-1}$ in step 619. After $d_{inter}^{min}$ is determined, $|d_{intra}-d_{inter}^{min}|$ is calculated in step 615.

Meanwhile, if J is not 1 in step 605, $d_{intra}$ is set to $2^m$ in step 621 and it is determined whether R is less than $2^{m-1}$ in step 623. If R is less than $2^{m-1}$ ("Yes" path from decision step 623) $d_{inter}^{min}$ is set to $(2J-3) \times 2^{m-1}$ in step 625 and then the procedure goes to step 615. If R is equal to or greater than $2^{m-1}$ ("No" path from decision step 623), it is determined whether R is less than $3 \times 2^{m-2}$ in step 627. If R is less than $3 \times 2^{m-2}$ ("Yes" path from decision step 627), $d_{inter}^{min}$ is set to $(4J-3) \times 2^{m-2}$ in step 629. If R is equal to or greater than $3 \times 2^{m-2}$ ("No" path from decision step 627), $d_{inter}^{min}$ is set to $(2J-1) \times 2^{m-1}$ in step 631 and then the procedure goes to step 615.

Optimal interleaver parameters m and J are achieved for a given N by computing $|d_{intra} - d_{inter}^{min}|$, changing (m, J). If J is one of 1, 2 and 3, a logical formula that facilitates selection of J without the repeated computation can be derived.

With a description of a logical equation deriving procedure omitted, the logical equation is If $\log_2 N - \lfloor \log_2 N \rfloor < \log_2 3 - 1 = 0.5849625$, (7)

$$\text{For } \left(\frac{3}{4}\right) \cdot 2^{\lfloor \log_2 N \rfloor} \leq N < 1 \cdot 2^{\lfloor \log_2 N \rfloor}, J = 3,$$

$$\text{For } 1 \cdot 2^{\lfloor \log_2 N \rfloor} \leq N < \left(\frac{3}{2}\right) \cdot 2^{\lfloor \log_2 N \rfloor}, J = 2,$$

$$\text{For } \left(\frac{3}{2}\right) \cdot 2^{\lfloor \log_2 N \rfloor} \leq N < 2 \cdot 2^{\lfloor \log_2 N \rfloor}, J = 1.$$

Else if $\log_2 N - \lfloor \log_2 N \rfloor \geq \log_2 3 - 1 = 0.5849625$, $$\text{For } 1 \cdot 2^{\lfloor \log_2 N \rfloor} \leq N < \left(\frac{3}{2}\right) \cdot 2^{\lfloor \log_2 N \rfloor}, J = 2,$$

$$\text{For } \left(\frac{3}{2}\right) \cdot 2^{\lfloor \log_2 N \rfloor} \leq N < \left(\frac{7}{4}\right) \cdot 2^{\lfloor \log_2 N \rfloor}, J = 3,$$

$$\text{For } \left(\frac{7}{4}\right) \cdot 2^{\lfloor \log_2 N \rfloor} \leq N < 2 \cdot 2^{\lfloor \log_2 N \rfloor}, J = 1.$$

From an optimal J from Eq. (7), an optimal m is calculated by $$m = \left\lfloor \log_2 \left(\frac{N}{J}\right) \right\rfloor \quad (8)$$

The selection of optimal interleaver parameters by the simple logical equations is summarized below and illustrated in FIG. 7.
1. An optimal J is obtained by Eq. (7) for a given N; and
2. m is calculated by computing Eq. (8) using N and J.

Figure 7:
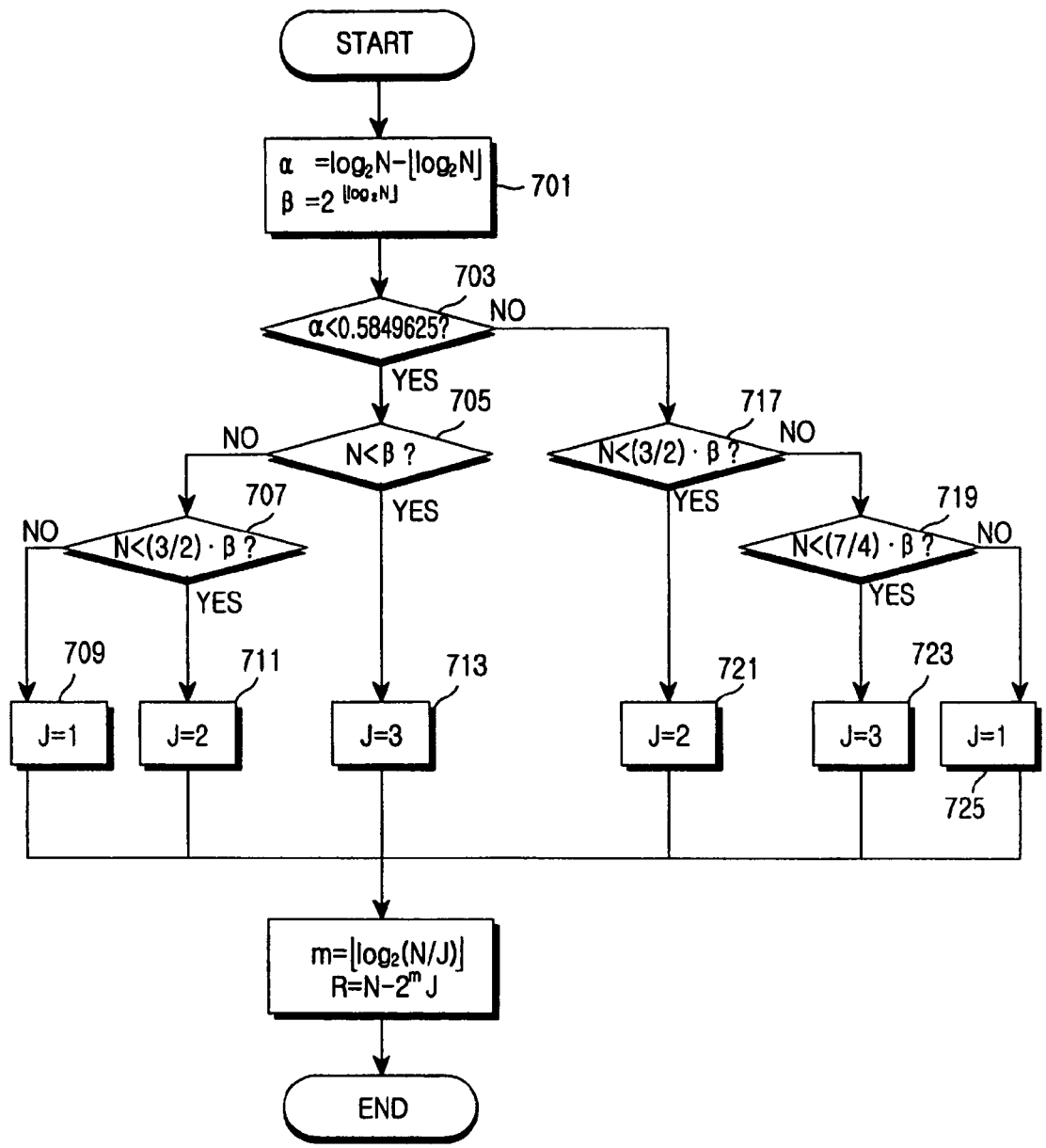
FIG. 7 is a flowchart illustrating another example of the optimal interleaver parameters determining operation according to an embodiment of the present invention.

FIG. 7 is a flowchart illustrating an optimal interleaver parameters determining operation according to another embodiment of the present invention.

Referring to FIG. 7, when N is given, a variable $\alpha$ is calculated by $\log_2 N - \lfloor \log_2 N \rfloor$ and a variable $\beta$ is calculated by $2^{\lfloor \log_2 N \rfloor}$ in step 701. Decision step 703, determines whether $\alpha$ is less than a first threshold, 0.5849625. If $\alpha$ is less than the first threshold ("Yes" path from decision step 703), another decision is made, whether N is less than $\beta$ in decision step 705. If N is equal to or greater than $\beta$ ("No" path from decision step 705), the procedure goes to step 707. On the contrary, if N is less than $\beta$ ("Yes" path from decision step 705), J is determined to be 3 in step 713.

Meanwhile, decision step 707 determines whether N is less than $(3/2) \times \beta$. If N is less than $(3/2) \times \beta$ ("Yes" path from decision step 707), J is determined to be 2 in step 711. Otherwise, J is determined to be 1 in step 709 ("No" path from decision step 707).

If $\alpha$ is equal to or greater than the first threshold in step 703 ("No" path from decision step 703), a decision is made whether N is less than $(3/2) \times \beta$ in decision step 717. If N is less than $(3/2) \times \beta$ ("Yes" path from decision step 717), J is determined to be 2 in step 721. Otherwise, decision step 719 determines whether N is less than $(7/4) \times \beta$. If N is less than $(7/4) \times \beta$ ("Yes" path from decision step 719), J is determined to be 3 in step 723. Otherwise, J is determined to be 1 in step 725 ("No" path from decision step 719).

As described above, optimal m and J can be calculated simply by the logical equations using N. The optimal m and J are equal to m and J resulting from repeated computation using different (m, J) values as illustrated in Table 2. This obviates the need for storing optimal m and J values according to N values.

When N=2328, for example, optimal m and J values are calculated in the procedure illustrated in FIG. 7 or by Eq. (8) to Eq. (10), as follows.

$\alpha = \log_2 N - \lfloor \log_2 N \rfloor = \log_2 2328 - \lfloor \log_2 2328 \rfloor = 11.1848753 - 11 = 0.1848753$.

$\beta = 2^{\lfloor \log_2 N \rfloor} = 2^{\lfloor \log_2 2328 \rfloor} = 2^{11} = 2048$.

$\alpha \leq 0.5849625$ and $\beta = 2048 \leq N = 2328 < \left(\frac{3}{2}\right) \cdot \beta = 3072$. Thus $J = 2$.

$$m = \left\lfloor \log_2 \frac{N}{J} \right\rfloor = \left\lfloor \log_2 \left(\frac{2328}{2}\right) \right\rfloor = \lfloor \log_2 1164 \rfloor = 10,$$

$$R = N - 2^m \cdot J = 2328 - 2^{10} \cdot 2 = 280.$$

For reference, Eq. (7) is derived as follows.
In each case depicted in FIG. 6, Eq. (5) and Eq. (6), $|d_{intra} - d_{inter}^{min}|$ is determined by When J=1,     A.

If R=0, $|d_{intra} - d_{inter}^{min}| = |0 - 2^{m-2}| = 2^{m-2}$     A-1.

If $0 < R < 3 \cdot 2^{m-2}$, $|d_{intra} - d_{inter}^{min}| = |2^m - 2^{m-2}| = 3 \cdot 2^{m-2}$     A-2.

If $3 \cdot 2^{m-2} \leq R < 2^m$, $|d_{intra} - d_{inter}^{min}| = |2^m - 2^{m-1}| = 2^{m-1}$     A-3.

When J≠1,     B.

If $0 \leq R < 2^{m-1}$, $|d_{intra} - d_{inter}^{min}| = |2^m - (2J-3) \cdot 2^{m-1}| = |2J-5| \cdot 2^{m-1}$     B-1.

If $2^{m-1} \leq R < 3 \cdot 2^{m-2}$, $|d_{intra} - d_{inter}^{min}| = |2^m - (4J-3) \cdot 2^{m-2}| = |4J-7| \cdot 2^{m-2}$     B-2.

If $3 \cdot 2^{m-2} \leq R < 2^m$, $|d_{intra} - d_{inter}^{min}| = |2^m - (2J-1) \cdot 2^{m-1}| = |2J-3| \cdot 2^{m-1}$     B-3.

Since $N = 2^m \cdot J + R$ and $0 \leq R < 2^m$, $J \cdot 2^m \leq N < (J+1) \cdot 2^m$. When this is divided by J and then subject to a log base 2 operation, $$m \leq \log_2\left(\frac{N}{J}\right) < \log_2\left(\left(\frac{J+1}{J}\right) \cdot 2^m\right) = m + \log_2\left(1 + \frac{1}{J}\right) < m + 1$$

Thus, $$m = \left\lfloor \log_2\left(\frac{N}{J}\right) \right\rfloor.$$

Using $$m = \left\lfloor \log_2\left(\frac{N}{J}\right) \right\rfloor,$$

J can be expressed as a function of N for all the cases of A and B.

A'. When J=1, since $m=\lfloor \log_2 N \rfloor$, $R=N-2^m=N-2^{\lfloor \log_2 N \rfloor}$. Then the cases A-1, A-2 and A-3 can be expressed as functions of N. It therefore follows that:

$A'-1$: If $N = 2^{\lfloor \log_2 N \rfloor}$, $|d_{intra} - d_{inter}^{\min}| = 2^{m-2} = \left(\frac{1}{4}\right) \cdot 2^{\lfloor \log_2 N \rfloor}$ $A'-2$: If $2^{\lfloor \log_2 N \rfloor} \le N < \left(\frac{7}{4}\right) \cdot 2^{\lfloor \log_2 N \rfloor}$, $|d_{intra} - d_{inter}^{\min}| = \left(\frac{3}{4}\right) \cdot 2^{\lfloor \log_2 N \rfloor}$ $A'-3$: If $\left(\frac{7}{4}\right) \cdot 2^{\lfloor \log_2 N \rfloor} \le N < 2 \cdot 2^{\lfloor \log_2 N \rfloor}$, $|d_{intra} - d_{inter}^{\min}| = \left(\frac{1}{2}\right) \cdot 2^{\lfloor \log_2 N \rfloor}$ $B'$. When $J \ne 1$, since $m = \left\lfloor \log_2\left(\frac{N}{J}\right) \right\rfloor$, $R = N - J \cdot 2^m = N - J \cdot 2^{\lfloor \log_2(\frac{N}{J}) \rfloor}$.

Then the cases B-1, B-2 and B-3 can be expressed as functions of N instead of R. Therefore, $B'-1$: If $J \cdot 2^{\lfloor \log_2(\frac{N}{J}) \rfloor} \le N < \left(J + \frac{1}{2}\right) \cdot 2^{\lfloor \log_2(\frac{N}{J}) \rfloor}$, $|d_{intra} - d_{inter}^{\min}| = \left|J - \frac{5}{2}\right| \cdot 2^{\lfloor \log_2(\frac{N}{J}) \rfloor}$ $B'-2$: If $\left(J + \frac{1}{2}\right) \cdot 2^{\lfloor \log_2(\frac{N}{J}) \rfloor} \le N < \left(J + \frac{3}{4}\right) \cdot 2^{\lfloor \log_2(\frac{N}{J}) \rfloor}$, $|d_{intra} - d_{inter}^{\min}| = \left|J - \frac{7}{4}\right| \cdot 2^{\lfloor \log_2(\frac{N}{J}) \rfloor}$ $B'-3$: If $\left(J + \frac{3}{4}\right) \cdot 2^{\lfloor \log_2(\frac{N}{J}) \rfloor} \le N < (J+1) \cdot 2^{\lfloor \log_2(\frac{N}{J}) \rfloor}$, $|d_{intra} - d_{inter}^{\min}| = \left|J - \frac{3}{2}\right| \cdot 2^{\lfloor \log_2(\frac{N}{J}) \rfloor}$ $B''$. When $J = 2$, since $\left\lfloor \log_2\left(\frac{N}{2}\right) \right\rfloor = \lfloor \log_2 N - 1 \rfloor = \lfloor \log_2 N \rfloor - 1$, $B''-1$: If $2^{\lfloor \log_2 N \rfloor} \le N < \left(\frac{5}{4}\right) \cdot 2^{\lfloor \log_2 N \rfloor}$, $|d_{intra} - d_{inter}^{\min}| = \frac{1}{4} \cdot 2^{\lfloor \log_2 N \rfloor}$ $B''-2$: If $\left(\frac{5}{4}\right) \cdot 2^{\lfloor \log_2 N \rfloor} \le N < \left(\frac{11}{8}\right) \cdot 2^{\lfloor \log_2 N \rfloor}$, $|d_{intra} - d_{inter}^{\min}| = \frac{1}{8} \cdot 2^{\lfloor \log_2 N \rfloor}$ $B''-3$: If $\left(\frac{11}{8}\right) \cdot 2^{\lfloor \log_2 N \rfloor} \le N < \left(\frac{3}{2}\right) \cdot 2^{\lfloor \log_2 N \rfloor}$, $|d_{intra} - d_{inter}^{\min}| = \frac{1}{4} \cdot 2^{\lfloor \log_2 N \rfloor}$ $B'''$. When $J = 3$, since $\left\lfloor \log_2\left(\frac{N}{3}\right) \right\rfloor = $ $\begin{cases} \lfloor \log_2 N \rfloor - 2, & \text{if } \log_2 N - \lfloor \log_2 N \rfloor < \log_2 3 - 1 \\ \lfloor \log_2 N \rfloor - 1, & \text{otherwise} \end{cases}$, if $\log_2 N - \lfloor \log_2 N \rfloor < \log_2 3 - 1 = 0.5849625$, $B'''-1'$: If $\left(\frac{3}{4}\right) \cdot 2^{\lfloor \log_2 N \rfloor} \le N < \left(\frac{7}{8}\right) \cdot 2^{\lfloor \log_2 N \rfloor}$, $|d_{intra} - d_{inter}^{\min}| = \frac{1}{8} \cdot 2^{\lfloor \log_2 N \rfloor}$ $B'''-2'$: If $\left(\frac{7}{8}\right) \cdot 2^{\lfloor \log_2 N \rfloor} \le N < \left(\frac{15}{16}\right) \cdot 2^{\lfloor \log_2 N \rfloor}$, $|d_{intra} - d_{inter}^{\min}| = \frac{5}{16} \cdot 2^{\lfloor \log_2 N \rfloor}$ $B'''-3'$: If $\left(\frac{15}{16}\right) \cdot 2^{\lfloor \log_2 N \rfloor} \le N < 2^{\lfloor \log_2 N \rfloor}$, $|d_{intra} - d_{inter}^{\min}| = \frac{3}{8} \cdot 2^{\lfloor \log_2 N \rfloor}$ if $\log_2 N - \lfloor \log_2 N \rfloor \ge \log_2 3 - 1 = 0.5849625$, $B'''-1''$: If $\left(\frac{3}{2}\right) \cdot 2^{\lfloor \log_2 N \rfloor} \le N < \left(\frac{7}{4}\right) \cdot 2^{\lfloor \log_2 N \rfloor}$, $|d_{intra} - d_{inter}^{\min}| = \frac{1}{4} \cdot 2^{\lfloor \log_2 N \rfloor}$ $B'''-2''$: If $\left(\frac{7}{4}\right) \cdot 2^{\lfloor \log_2 N \rfloor} \le N < \left(\frac{15}{8}\right) \cdot 2^{\lfloor \log_2 N \rfloor}$, $|d_{intra} - d_{inter}^{\min}| = \frac{5}{8} \cdot 2^{\lfloor \log_2 N \rfloor}$ $B'''-3''$: If $\left(\frac{15}{8}\right) \cdot 2^{\lfloor \log_2 N \rfloor} \le N < 2 \cdot 2^{\lfloor \log_2 N \rfloor}$, $|d_{intra} - d_{inter}^{\min}| = \frac{3}{4} \cdot 2^{\lfloor \log_2 N \rfloor}$ If J is 4 or more, this case is neglected because $|d_{intra} - d_{inter}^{\min}|$ cannot be less that $|d_{intra} - d_{inter}^{\min}|$ in any of the cases where J=1, 2, and 3.

Eq. (7) is obtained by selecting a case having a minimum $|d_{intra-dinter}^{\min}|$ among the cases of A'-1, A'-2, A'-3, B''-1, B''-2, B''-3, B'''-1', B'''-2', and B'''-3'. Similarly, Eq. (8) is obtained by selecting a case having a minimum $|d_{intra} - d_{inter}^{\min}|$ among the cases of A'-1, A'-2, A'-3, B''-1, B''-2, B''-3, B'''-1'', B'''-2'', and B'''-3''.

In accordance with the embodiments of the present invention as described above, interleaver parameters m and J are simply optimized according to an interleaver size N, for P-BRO interleaving.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A method of determining interleaver parameters m and J according to an interleaver size N to sequentially store input data in a memory having a row×column matrix structure and partial-bit reversal order (P-BRO) interleaving the stored data, the parameters N, m, J, and R being expressed as $N = 2^m \times J + R$ ($0 \le R < 2^m$), the method comprising:

calculating a first variable $\alpha$ by ($\log_2 N - \lfloor \log_2 N \rfloor$) and a second variable $\beta$ by ($2^{\lfloor \log_2 N \rfloor}$);

comparing the first variable with a selected first threshold;

comparing the second variable with at least one predetermined second threshold;

determining a first parameter J according to the comparison results; and determining a second parameter m by $$\left\lfloor \log_2\left(\frac{N}{J}\right)\right\rfloor.$$

2. The method of claim 1, wherein the first parameter J is determined according to the following Equation If $\log_2 N - \lfloor\log_2 N\rfloor < \log_2 3 - 1 = 0.5849625$, $$\text{For } \left(\frac{3}{4}\right)\cdot 2^{\lfloor\log_2 N\rfloor} \leq N < 1\cdot 2^{\lfloor\log_2 N\rfloor}, \quad J = 3,$$

$$\text{For } 1\cdot 2^{\lfloor\log_2 N\rfloor} \leq N < \left(\frac{3}{2}\right)\cdot 2^{\lfloor\log_2 N\rfloor}, \quad J = 2,$$

$$\text{For } \left(\frac{3}{2}\right)\cdot 2^{\lfloor\log_2 N\rfloor} \leq N < 2\cdot 2^{\lfloor\log_2 N\rfloor}, \quad J = 1.$$

Else if $\log_2 N - \lfloor\log_2 N\rfloor \geq \log_2 3 - 1 = 0.5849625$, $$\text{For } 1\cdot 2^{\lfloor\log_2 N\rfloor} \leq N < \left(\frac{3}{2}\right)\cdot 2^{\lfloor\log_2 N\rfloor}, \quad J = 2,$$

$$\text{For } \left(\frac{3}{2}\right)\cdot 2^{\lfloor\log_2 N\rfloor} \leq N < \left(\frac{7}{4}\right)\cdot 2^{\lfloor\log_2 N\rfloor}, \quad J = 3,$$

$$\text{For } \left(\frac{7}{4}\right)\cdot 2^{\lfloor\log_2 N\rfloor} \leq N < 2\cdot 2^{\lfloor\log_2 N\rfloor}, \quad J = 1.$$

3. The method of claim 2, wherein the parameters N, m, J, and R are determined to be

| N | m | J | R |
|---|---|---|---|
| 408 | 7 | 4 | 24 |
| 792 | 8 | 4 | 24 |
| 1560 | 9 | 4 | 24 |
| 2328 | 10 | 3 | 280 |
| 3096 | 10 | 4 | 24 |
| 3864 | 11 | 2 | 1816. |

4. An interleaver in a communication system, comprising:
a memory having a row×column matrix; and
an address generator adapted to partial-bit reversal order (P-BRO) interleaves addresses of the memory, calculate a first variable α by $(\log_2 N - \lfloor\log_2 N\rfloor)$ using a given interleaver size N and a second variable β by $(2^{\lfloor\log_2 N\rfloor})$, compare the first variable with a predetermined first threshold, compare the second variable with at least one determined second threshold, determine a first parameter J according to the comparison results, calculate a second parameter m by $$\left\lfloor \log_2\left(\frac{N}{J}\right)\right\rfloor,$$

calculate a third parameter R by $N = 2^m \times J + R$, sequentially arrange by columns an input data stream of size N in a matrix having $2^m$ rows and J columns, and in R rows in a Jth column $(0 \leq R < 2^m)$, P-BRO interleave the arranged data and generate read addresses interleaved data by rows.

5. The method of claim 4, wherein the parameters N, m, J, and R are determined to be

| N | m | J | R |
|---|---|---|---|
| 408 | 7 | 4 | 24 |
| 792 | 8 | 4 | 24 |
| 1560 | 9 | 4 | 24 |
| 2328 | 10 | 3 | 280 |
| 3096 | 10 | 4 | 24 |
| 3864 | 11 | 2 | 1816. |

\* \* \* \* \*